(12) United States Patent
Gosnell et al.

(10) Patent No.: US 10,899,120 B2
(45) Date of Patent: Jan. 26, 2021

(54) PROCESS FOR TRANSFERRING MICROSTRUCTURES TO A FINAL SUBSTRATE

(71) Applicant: Visual Physics, LLC, Alpharetta, GA (US)

(72) Inventors: Jonathan D. Gosnell, Cumming, GA (US); Gregory R. Jordan, Cumming, GA (US); Caroline B. Kennedy, Winter Springs, FL (US)

(73) Assignee: Visual Physics, LLC, Alpharetta, GA (US)

( * ) Notice: Subject to any disclaimer, the term of this patent is extended or adjusted under 35 U.S.C. 154(b) by 0 days.

(21) Appl. No.: 16/198,952

(22) Filed: Nov. 23, 2018

(65) Prior Publication Data

US 2019/0105887 A1    Apr. 11, 2019

Related U.S. Application Data

(62) Division of application No. 14/421,394, filed as application No. PCT/US2012/051395 on Aug. 17, 2012, now Pat. No. 10,173,405.

(51) Int. Cl.
*B32B 37/00* (2006.01)
*B42D 25/00* (2014.01)
(Continued)

(52) U.S. Cl.
CPC ............ *B32B 37/025* (2013.01); *B32B 37/12* (2013.01); *B32B 37/24* (2013.01); *B32B 38/10* (2013.01);
(Continued)

(58) Field of Classification Search
None
See application file for complete search history.

(56) References Cited

U.S. PATENT DOCUMENTS

| 992,151 A | 5/1911 | Berthon |
| 1,824,353 A | 9/1931 | Jensen |

(Continued)

FOREIGN PATENT DOCUMENTS

| AU | 2009278275 | 7/2012 |
| CA | 2741298 | 4/2010 |

(Continued)

OTHER PUBLICATIONS

Egyptian Patent Office, "Technical Report," Application No. EG2015020243, Feb. 12, 2019, 7 pages.

(Continued)

*Primary Examiner* — Linda L Gray

(57) ABSTRACT

A process for transferring microstructures to a flexible or rigid final substrate that offers advantages in both speed and precision is provided. The inventive process involves subjecting a transfer film in a continuous roll-to-roll process to the following operations: either forming microstructures on, or transferring microstructures to a surface of the transfer film; and then transferring the microstructures from the transfer film onto a surface of the final substrate. The microstructures are single or multi-layer structures that are made up of: voids in a substantially planar surface, the voids optionally filled or coated with another material; raised areas in a substantially planar surface; or combinations thereof.

7 Claims, 1 Drawing Sheet

(51) Int. Cl.

| | | |
|---|---|---|
| *B44C 1/00* | (2006.01) | |
| *B32B 38/00* | (2006.01) | |
| *B42D 25/455* | (2014.01) | |
| *B44C 1/17* | (2006.01) | |
| *B42D 25/29* | (2014.01) | |
| *B42D 25/47* | (2014.01) | |
| *B81C 1/00* | (2006.01) | |
| *B42D 25/355* | (2014.01) | |
| *B32B 37/12* | (2006.01) | |
| *B32B 37/24* | (2006.01) | |
| *B32B 38/10* | (2006.01) | |
| *B32B 38/18* | (2006.01) | |
| *B42D 15/00* | (2006.01) | |

(52) U.S. Cl.
CPC .............. *B32B 38/18* (2013.01); *B42D 15/00* (2013.01); *B42D 25/29* (2014.10); *B42D 25/355* (2014.10); *B42D 25/455* (2014.10); *B42D 25/47* (2014.10); *B44C 1/172* (2013.01); *B81C 1/00206* (2013.01); *B32B 2037/243* (2013.01); *B32B 2305/022* (2013.01); *B32B 2307/202* (2013.01); *B32B 2307/748* (2013.01); *B32B 2315/08* (2013.01); *B32B 2457/208* (2013.01); *B32B 2519/00* (2013.01); *B32B 2554/00* (2013.01); *B44C 1/1716* (2013.01); *Y10T 428/24355* (2015.01)

(56) References Cited

U.S. PATENT DOCUMENTS

| | | |
|---|---|---|
| 1,849,036 A | 3/1932 | Ernst |
| 1,942,841 A | 1/1934 | Shimizu |
| 2,268,351 A | 12/1941 | Tanaka |
| 2,355,902 A | 8/1944 | Berg |
| 2,432,896 A | 12/1947 | Hotchner |
| 2,888,855 A | 6/1959 | Tanaka |
| 2,992,103 A | 7/1961 | Land et al. |
| 3,122,853 A | 3/1964 | Koonz et al. |
| 3,241,429 A | 3/1966 | Rice et al. |
| 3,264,164 A | 8/1966 | Jerothe et al. |
| 3,312,006 A | 4/1967 | Rowland |
| 3,357,772 A | 12/1967 | Rowland |
| 3,357,773 A | 12/1967 | Rowland |
| 3,463,581 A | 8/1969 | Clay |
| 3,609,035 A | 9/1971 | Ataka |
| 3,643,361 A | 2/1972 | Eaves |
| 3,704,068 A | 11/1972 | Waly |
| 3,801,183 A | 4/1974 | Sevelin et al. |
| 3,811,213 A | 5/1974 | Eaves |
| 3,887,742 A | 6/1975 | Reinnagel |
| 4,025,673 A | 5/1977 | Reinnagel |
| 4,073,650 A | 2/1978 | Yevick |
| 4,082,426 A | 4/1978 | Brown |
| 4,185,191 A | 1/1980 | Stauffer |
| 4,345,833 A | 8/1982 | Siegmund |
| 4,417,784 A | 11/1983 | Knop et al. |
| 4,498,736 A | 2/1985 | Griffin |
| 4,507,349 A | 3/1985 | Fromson et al. |
| 4,519,632 A | 5/1985 | Parkinson et al. |
| 4,534,398 A | 8/1985 | Crane |
| 4,634,220 A | 1/1987 | Hockert et al. |
| 4,645,301 A | 2/1987 | Orensteen et al. |
| 4,662,651 A | 5/1987 | Mowry, Jr. |
| 4,688,894 A | 8/1987 | Hockert |
| 4,691,993 A | 9/1987 | Porter et al. |
| 4,756,972 A | 7/1988 | Kloosterboer et al. |
| 4,765,656 A | 8/1988 | Becker et al. |
| 4,814,594 A | 3/1989 | Drexler |
| 4,892,336 A | 1/1990 | Kaule et al. |
| 4,892,385 A | 1/1990 | Webster, Jr. et al. |
| 4,920,039 A | 4/1990 | Fotland et al. |
| 4,935,335 A | 6/1990 | Fotland |
| 4,988,126 A | 1/1991 | Heckenkamp et al. |
| 5,044,707 A | 9/1991 | Mallik |
| 5,074,649 A | 12/1991 | Hamanaka |
| 5,085,514 A | 2/1992 | Mallik et al. |
| 5,135,262 A | 8/1992 | Smith et al. |
| 5,142,383 A | 8/1992 | Mallik |
| 5,211,424 A | 5/1993 | Bliss |
| 5,215,864 A | 6/1993 | Laakmann |
| 5,232,764 A | 8/1993 | Oshima |
| 5,254,390 A | 10/1993 | Lu |
| 5,282,650 A | 2/1994 | Smith et al. |
| 5,359,454 A | 10/1994 | Steenblik et al. |
| 5,384,861 A | 1/1995 | Mattson et al. |
| 5,393,099 A | 2/1995 | D'Amato |
| 5,393,590 A | 2/1995 | Caspari |
| 5,413,839 A | 5/1995 | Chatwin et al. |
| 5,433,807 A | 7/1995 | Heckenkamp et al. |
| 5,438,928 A | 8/1995 | Chatwin et al. |
| 5,449,200 A | 9/1995 | Andric et al. |
| 5,460,679 A | 10/1995 | Abdel-Kader |
| 5,461,495 A | 10/1995 | Steenblik et al. |
| 5,464,690 A | 11/1995 | Boswell |
| 5,468,540 A | 11/1995 | Lu |
| 5,479,507 A | 12/1995 | Anderson |
| 5,492,370 A | 2/1996 | Chatwin et al. |
| 5,503,902 A | 4/1996 | Steenblik et al. |
| 5,538,753 A | 7/1996 | Antes et al. |
| 5,543,942 A | 8/1996 | Mizuguchi et al. |
| 5,555,476 A | 9/1996 | Suzuki et al. |
| 5,567,276 A | 10/1996 | Boehm et al. |
| 5,568,313 A | 10/1996 | Steenblik et al. |
| 5,574,083 A | 11/1996 | Brown et al. |
| 5,575,507 A | 11/1996 | Yamauchi et al. |
| 5,598,281 A | 1/1997 | Zimmerman et al. |
| 5,623,347 A | 4/1997 | Pizzanelli |
| 5,623,368 A | 4/1997 | Calderini et al. |
| 5,626,969 A | 5/1997 | Joson |
| 5,631,039 A | 5/1997 | Knight et al. |
| 5,639,126 A | 6/1997 | Dames et al. |
| 5,642,226 A | 6/1997 | Rosenthal |
| 5,643,678 A | 7/1997 | Boswell |
| 5,670,003 A | 9/1997 | Boswell |
| 5,670,096 A | 9/1997 | Lu |
| 5,674,580 A | 10/1997 | Boswell |
| 5,688,587 A | 11/1997 | Burchard et al. |
| 5,695,346 A | 12/1997 | Sekiguchi et al. |
| 5,712,731 A | 1/1998 | Drinkwater et al. |
| 5,723,200 A | 3/1998 | Oshima et al. |
| 5,731,064 A | 3/1998 | Süss |
| 5,737,126 A | 4/1998 | Lawandy |
| 5,753,349 A | 5/1998 | Boswell |
| 5,759,683 A | 6/1998 | Boswell |
| 5,763,349 A | 6/1998 | Zandona |
| 5,783,017 A | 7/1998 | Boswell |
| 5,783,275 A | 7/1998 | Mück et al. |
| 5,800,907 A | 9/1998 | Yumoto |
| 5,810,957 A | 9/1998 | Boswell |
| 5,812,313 A | 9/1998 | Johansen et al. |
| 5,886,798 A | 3/1999 | Staub et al. |
| 5,933,276 A | 8/1999 | Magee |
| 5,949,420 A | 9/1999 | Terlutter |
| 5,995,638 A | 11/1999 | Amidror et al. |
| 6,030,691 A | 2/2000 | Burchard et al. |
| 6,036,230 A | 3/2000 | Farber |
| 6,036,233 A | 3/2000 | Braun et al. |
| 6,060,143 A | 5/2000 | Tompkin et al. |
| 6,084,713 A | 7/2000 | Rosenthal |
| 6,089,614 A | 7/2000 | Howland et al. |
| 6,106,950 A | 8/2000 | Searle et al. |
| 6,176,582 B1 | 1/2001 | Grasnick |
| 6,177,953 B1 | 1/2001 | Vachette et al. |
| 6,179,338 B1 | 1/2001 | Bergmann et al. |
| 6,195,150 B1 | 2/2001 | Silverbrook |
| 6,249,588 B1 | 6/2001 | Amidror et al. |
| 6,256,149 B1 | 7/2001 | Rolfe |
| 6,256,150 B1 | 7/2001 | Rosenthal |
| 6,283,509 B1 | 9/2001 | Braun et al. |
| 6,288,842 B1 | 9/2001 | Florczak et al. |
| 6,297,911 B1 | 10/2001 | Nishikawa et al. |

(56) References Cited

U.S. PATENT DOCUMENTS

| | | | |
|---|---|---|---|
| 6,301,363 B1 | 10/2001 | Mowry, Jr. |
| 6,302,989 B1 | 10/2001 | Kaule |
| 6,328,342 B1 | 12/2001 | Belousov et al. |
| 6,329,040 B1 | 12/2001 | Oshima et al. |
| 6,329,987 B1 | 12/2001 | Gottfried et al. |
| 6,345,104 B1 | 2/2002 | Rhoads |
| 6,348,999 B1 | 2/2002 | Summersgill et al. |
| 6,350,036 B1 | 2/2002 | Hannington et al. |
| 6,369,947 B1 | 4/2002 | Staub et al. |
| 6,373,965 B1 | 4/2002 | Liang |
| 6,381,071 B1 | 4/2002 | Dona et al. |
| 6,404,555 B1 | 6/2002 | Nishikawa |
| 6,405,464 B1 | 6/2002 | Gulick, Jr. et al. |
| 6,414,794 B1 | 7/2002 | Rosenthal |
| 6,424,467 B1 | 7/2002 | Goggins |
| 6,433,844 B2 | 8/2002 | Li |
| 6,450,540 B1 | 9/2002 | Kim |
| 6,467,810 B2 | 10/2002 | Taylor et al. |
| 6,473,238 B1 | 10/2002 | Daniell |
| 6,483,644 B1 | 11/2002 | Gottfried et al. |
| 6,500,526 B1 | 12/2002 | Hannington |
| 6,521,324 B1 * | 2/2003 | Debe ............... B41M 5/38207 156/235 |
| 6,542,646 B1 | 4/2003 | Bar-Yona |
| 6,558,009 B2 | 5/2003 | Hannington et al. |
| 6,587,276 B2 | 7/2003 | Daniell |
| 6,616,803 B1 | 9/2003 | Isherwood et al. |
| 6,618,201 B2 | 9/2003 | Nishikawa et al. |
| 6,641,270 B2 | 11/2003 | Hannington et al. |
| 6,671,095 B2 | 12/2003 | Summersgill et al. |
| 6,712,399 B1 | 3/2004 | Drinkwater et al. |
| 6,721,101 B2 | 4/2004 | Daniell |
| 6,724,536 B2 | 4/2004 | Magee |
| 6,726,858 B2 | 4/2004 | Andrews |
| 6,751,024 B1 | 6/2004 | Rosenthal |
| 6,761,377 B2 | 7/2004 | Taylor et al. |
| 6,795,250 B2 | 9/2004 | Johnson et al. |
| 6,803,088 B2 | 10/2004 | Kaminsky et al. |
| 6,819,775 B2 | 11/2004 | Amidror et al. |
| 6,833,960 B1 | 12/2004 | Scarbrough et al. |
| 6,856,462 B1 | 2/2005 | Scarbrough et al. |
| 6,870,681 B1 | 3/2005 | Magee |
| 6,900,944 B2 | 5/2005 | Tomczyk |
| 6,935,756 B2 | 8/2005 | Sewall et al. |
| 7,030,997 B2 | 4/2006 | Neureuther et al. |
| 7,058,202 B2 | 6/2006 | Amidror |
| 7,068,434 B2 | 6/2006 | Florczak et al. |
| 7,114,750 B1 | 10/2006 | Alasia et al. |
| 7,194,105 B2 | 3/2007 | Hersch et al. |
| 7,246,824 B2 | 7/2007 | Hudson |
| 7,254,265 B2 | 8/2007 | Naske et al. |
| 7,255,911 B2 | 8/2007 | Lutz et al. |
| 7,288,320 B2 | 10/2007 | Steenblik et al. |
| 7,333,268 B2 | 2/2008 | Steenblik et al. |
| 7,336,422 B2 | 2/2008 | Dunn et al. |
| 7,372,631 B2 | 5/2008 | Ozawa |
| 7,389,939 B2 | 6/2008 | Jones et al. |
| 7,422,781 B2 | 9/2008 | Gosselin |
| 7,457,038 B2 | 11/2008 | Dolgoff |
| 7,457,039 B2 | 11/2008 | Raymond et al. |
| 7,468,842 B2 | 12/2008 | Steenblik et al. |
| 7,504,147 B2 | 3/2009 | Hannington |
| 7,545,567 B2 | 6/2009 | Tomczyk |
| 7,609,450 B2 | 10/2009 | Niemuth |
| 7,630,954 B2 | 12/2009 | Adamczyk et al. |
| 7,686,187 B2 | 3/2010 | Pottish et al. |
| 7,712,623 B2 | 5/2010 | Wentz et al. |
| 7,719,733 B2 | 5/2010 | Schilling et al. |
| 7,738,175 B2 | 6/2010 | Steenblik et al. |
| 7,751,608 B2 | 7/2010 | Hersch et al. |
| 7,762,591 B2 | 7/2010 | Schilling et al. |
| 7,763,179 B2 | 7/2010 | Levy et al. |
| 7,812,935 B2 | 10/2010 | Cowbum et al. |
| 7,820,269 B2 | 10/2010 | Staub et al. |
| 7,830,627 B2 | 11/2010 | Commander et al. |
| 7,849,993 B2 | 12/2010 | Finkenzeller et al. |
| 8,027,093 B2 | 9/2011 | Commander et al. |
| 8,057,980 B2 | 11/2011 | Dunn et al. |
| 8,111,463 B2 | 2/2012 | Endle et al. |
| 8,149,511 B2 | 4/2012 | Kaule et al. |
| 8,241,732 B2 | 8/2012 | Hansen et al. |
| 8,284,492 B2 | 10/2012 | Crane et al. |
| 8,514,492 B2 | 8/2013 | Schilling et al. |
| 8,528,941 B2 | 9/2013 | Dörfler et al. |
| 8,537,470 B2 | 9/2013 | Endle et al. |
| 8,557,369 B2 | 10/2013 | Hoffmüller et al. |
| 8,693,101 B2 | 4/2014 | Tomczyk et al. |
| 8,867,134 B2 | 10/2014 | Steenblik et al. |
| 8,908,276 B2 | 12/2014 | Holmes |
| 2001/0048968 A1 | 12/2001 | Cox et al. |
| 2002/0014967 A1 | 2/2002 | Crane et al. |
| 2002/0114078 A1 | 8/2002 | Halle et al. |
| 2002/0185857 A1 | 12/2002 | Taylor et al. |
| 2003/0031861 A1 | 2/2003 | Reiter et al. |
| 2003/0112523 A1 | 6/2003 | Daniell |
| 2003/0157211 A1 | 8/2003 | Tsunetomo et al. |
| 2003/0179364 A1 | 9/2003 | Steenblik et al. |
| 2003/0183695 A1 | 10/2003 | Labrec et al. |
| 2003/0228014 A1 | 12/2003 | Alasia et al. |
| 2003/0232179 A1 | 12/2003 | Steenblik et al. |
| 2003/0234294 A1 | 12/2003 | Uchihiro et al. |
| 2004/0020086 A1 | 2/2004 | Hudson |
| 2004/0022967 A1 | 2/2004 | Lutz et al. |
| 2004/0065743 A1 | 4/2004 | Doublet |
| 2004/0100707 A1 | 5/2004 | Kay et al. |
| 2004/0140665 A1 | 7/2004 | Scarborough et al. |
| 2004/0209049 A1 | 10/2004 | Bak |
| 2005/0094274 A1 | 5/2005 | Souparis |
| 2005/0104364 A1 | 5/2005 | Keller et al. |
| 2005/0161501 A1 | 7/2005 | Giering et al. |
| 2005/0180020 A1 | 8/2005 | Steenblik et al. |
| 2005/0247794 A1 | 11/2005 | Jones et al. |
| 2006/0003295 A1 | 1/2006 | Hersch et al. |
| 2006/0011449 A1 | 1/2006 | Knoll |
| 2006/0017979 A1 | 1/2006 | Goggins |
| 2006/0018021 A1 | 1/2006 | Tompkins et al. |
| 2006/0061267 A1 | 3/2006 | Yamasaki |
| 2006/0227427 A1 | 10/2006 | Dolgoff |
| 2007/0058260 A1 | 3/2007 | Steenblik et al. |
| 2007/0092680 A1 | 4/2007 | Chathns et al. |
| 2007/0164555 A1 | 7/2007 | Mang et al. |
| 2007/0183045 A1 | 8/2007 | Shilling et al. |
| 2007/0183047 A1 | 8/2007 | Phillips et al. |
| 2007/0237938 A1 * | 10/2007 | Ouderkirk ............ G02B 5/0278 428/292.1 |
| 2007/0273143 A1 | 11/2007 | Crane et al. |
| 2007/0284546 A1 | 12/2007 | Ryzi et al. |
| 2007/0291362 A1 | 12/2007 | Hill et al. |
| 2008/0130018 A1 | 6/2008 | Steenblik et al. |
| 2008/0143095 A1 | 6/2008 | Isherwood et al. |
| 2008/0160226 A1 | 7/2008 | Kaule et al. |
| 2008/0182084 A1 | 7/2008 | Tompkin et al. |
| 2009/0008923 A1 | 1/2009 | Kaule et al. |
| 2009/0061159 A1 | 3/2009 | Staub |
| 2009/0243278 A1 | 10/2009 | Camus et al. |
| 2009/0290221 A1 | 11/2009 | Hansen et al. |
| 2009/0310470 A1 | 12/2009 | Yrjonen |
| 2009/0315316 A1 | 12/2009 | Staub et al. |
| 2010/0001508 A1 | 1/2010 | Tompkin et al. |
| 2010/0018644 A1 | 1/2010 | Sacks et al. |
| 2010/0045024 A1 | 2/2010 | Attner et al. |
| 2010/0068459 A1 | 3/2010 | Wang et al. |
| 2010/0084851 A1 | 4/2010 | Schilling |
| 2010/0109317 A1 | 5/2010 | Huffmuller et al. |
| 2010/0177094 A1 | 7/2010 | Kaule et al. |
| 2010/0182221 A1 | 7/2010 | Kaule et al. |
| 2010/0194532 A1 | 8/2010 | Kaule |
| 2010/0208036 A1 | 8/2010 | Kaule |
| 2010/0308571 A1 | 12/2010 | Steenblik et al. |
| 2010/0328922 A1 | 12/2010 | Peters et al. |
| 2011/0017498 A1 | 1/2011 | Lauffer et al. |
| 2011/0019283 A1 | 1/2011 | Steenblik et al. |
| 2011/0056638 A1 | 3/2011 | Rosset |
| 2011/0179631 A1 | 7/2011 | Gates et al. |

(56) References Cited

U.S. PATENT DOCUMENTS

| | | | |
|---|---|---|---|
| 2012/0019607 A1 | 1/2012 | Dunn et al. |
| 2012/0033305 A1 | 2/2012 | Moon et al. |
| 2012/0091703 A1 | 4/2012 | Maguire et al. |
| 2012/0098249 A1 | 4/2012 | Rahm et al. |
| 2012/0194916 A1 | 8/2012 | Cape et al. |
| 2012/0243744 A1 | 9/2012 | Camus et al. |
| 2013/0003354 A1 | 1/2013 | Meis et al. |
| 2013/0010048 A1 | 1/2013 | Dunn et al. |
| 2013/0038942 A1 | 2/2013 | Holmes |
| 2013/0044362 A1 | 2/2013 | Commander et al. |
| 2013/0154250 A1 | 6/2013 | Dunn et al. |
| 2014/0174306 A1 | 6/2014 | Wening et al. |
| 2014/0175785 A1 | 6/2014 | Kaule et al. |
| 2014/0353959 A1 | 12/2014 | Lochbihler |
| 2014/0367957 A1 | 12/2014 | Jordan |
| 2016/0176221 A1 | 6/2016 | Holmes |
| 2016/0257159 A1 | 9/2016 | Attner et al. |

FOREIGN PATENT DOCUMENTS

| | | |
|---|---|---|
| CN | 1102865 | 5/1995 |
| CN | 1126970 | 11/2003 |
| CN | 1950570 | 4/2007 |
| CN | 101678664 | 3/2010 |
| DE | 19804858 | 8/1999 |
| DE | 19932240 | 1/2001 |
| DE | 10100692 | 8/2004 |
| EP | 0090130 | 10/1983 |
| EP | 0092691 | 11/1983 |
| EP | 0118222 | 9/1984 |
| EP | 0156460 | 10/1985 |
| EP | 0203752 | 12/1986 |
| EP | 0253089 | 1/1988 |
| EP | 0318717 | 6/1989 |
| EP | 0415230 | 3/1991 |
| EP | 0319157 | 7/1992 |
| EP | 0801324 | 10/1997 |
| EP | 0887699 | 12/1998 |
| EP | 0930174 | 7/1999 |
| EP | 0997750 | 5/2000 |
| EP | 1002640 A1 | 5/2000 |
| EP | 1356952 | 10/2003 |
| EP | 1002640 | 5/2004 |
| EP | 1354925 | 4/2006 |
| EP | 1659449 | 5/2006 |
| EP | 1743778 | 1/2007 |
| EP | 1876028 | 1/2008 |
| EP | 1897700 | 3/2008 |
| EP | 1931827 | 4/2009 |
| EP | 2335937 | 6/2011 |
| EP | 2338682 | 6/2011 |
| EP | 2162294 | 3/2012 |
| FR | 2803939 | 7/2001 |
| FR | 2952194 | 5/2011 |
| GB | 1095286 | 12/1967 |
| GB | 2103669 | 2/1983 |
| GB | 2362493 | 11/2001 |
| GB | 2395724 | 6/2004 |
| GB | 2433470 | 6/2007 |
| GB | 2490780 | 11/2012 |
| JP | 41-004953 | 3/1966 |
| JP | 46-022600 | 8/1971 |
| JP | 04-234699 | 8/1992 |
| JP | H05-508119 | 11/1993 |
| JP | 10-035083 | 2/1998 |
| JP | 10-039108 | 2/1998 |
| JP | 11-501590 | 2/1999 |
| JP | 11-189000 | 7/1999 |
| JP | 2000-056103 | 2/2000 |
| JP | 2000-233563 | 8/2000 |
| JP | 2000-256994 | 9/2000 |
| JP | 2001-055000 | 2/2001 |
| JP | 2001-516899 | 10/2001 |
| JP | 2001-324949 | 11/2001 |
| JP | 2003-039583 | 2/2003 |
| JP | 2003-165289 | 6/2003 |
| JP | 2003-528349 | 9/2003 |
| JP | 2003-326876 | 11/2003 |
| JP | 2004-262144 | 9/2004 |
| JP | 2004-317636 | 11/2004 |
| JP | 2005-193501 | 7/2005 |
| JP | 2009-274293 | 11/2009 |
| JP | 2011-502811 | 1/2011 |
| KR | 10-0194536 | 6/1999 |
| KR | 2002170350000 | 3/2001 |
| KR | 2003119050000 | 5/2003 |
| KR | 1005443000000 | 1/2006 |
| KR | 1005613210000 | 3/2006 |
| RU | 2111125 | 5/1998 |
| RU | 2245566 | 1/2005 |
| RU | 2010101854 | 7/2011 |
| TW | 575740 | 2/2004 |
| WF | WO 2011/051669 | 5/2011 |
| WO | WO 1992/008998 | 5/1992 |
| WO | WO 1992/019994 | 11/1992 |
| WO | WO 1993/024332 | 12/1993 |
| WO | WO 1996/035971 | 11/1996 |
| WO | WO 1997/019820 | 6/1997 |
| WO | WO 1997/044769 | 11/1997 |
| WO | WO 1998/013211 | 4/1998 |
| WO | WO 1998/015418 | 4/1998 |
| WO | WO 1998/026373 | 6/1998 |
| WO | WO 1999/014725 | 3/1999 |
| WO | WO 1999/023513 | 5/1999 |
| WO | WO 1999/026793 | 6/1999 |
| WO | WO 1999/066356 | 12/1999 |
| WO | WO 2001/007268 | 2/2001 |
| WO | WO 2001/011591 | 2/2001 |
| WO | WO 2001/039138 | 5/2001 |
| WO | WO 2001/053113 | 7/2001 |
| WO | WO 2001/063341 | 8/2001 |
| WO | WO 2001/071410 | 9/2001 |
| WO | WO 2002/040291 | 5/2002 |
| WO | WO 2002/043012 | 5/2002 |
| WO | WO 2002/101669 | 12/2002 |
| WO | WO 2003/005075 | 1/2003 |
| WO | WO 2003/007276 | 1/2003 |
| WO | WO 2003/022598 | 3/2003 |
| WO | WO 2003/053713 | 7/2003 |
| WO | WO 2003/061980 | 7/2003 |
| WO | WO 2003/061983 | 7/2003 |
| WO | WO 2003/082598 | 10/2003 |
| WO | WO 2003/098188 | 11/2003 |
| WO | WO 2004/022355 | 3/2004 |
| WO | WO 2004/036507 | 4/2004 |
| WO | WO 2004/087430 | 10/2004 |
| WO | WO 2005/106601 | 11/2005 |
| WO | WO 2006/029744 | 3/2006 |
| WO | WO 2007/076952 | 7/2007 |
| WO | WO 2007/133613 | 11/2007 |
| WO | WO 2009/000527 | 12/2008 |
| WO | WO 2009/000528 | 12/2008 |
| WO | WO 2009/000529 | 12/2008 |
| WO | WO 2009/000530 | 12/2008 |
| WO | WO 2009/121784 | 10/2009 |
| WO | WO 2010/015383 | 2/2010 |
| WO | WO 2010/094691 | 12/2010 |
| WO | WO 2010/136339 | 12/2010 |
| WO | WO 2011/015384 | 2/2011 |
| WO | WO 2011/019912 | 2/2011 |
| WO | WO 2011/044704 | 4/2011 |
| WO | WO 2011/107793 | 9/2011 |
| WO | WO 2011/122943 | 10/2011 |
| WO | WO 2012/027779 | 3/2012 |
| WO | WO 2012/103441 | 8/2012 |
| WO | WO 2013/028534 | 2/2013 |
| WO | WO 2013/093848 | 6/2013 |
| WO | WO 2013/098513 | 7/2013 |

OTHER PUBLICATIONS

Office Action dated Dec. 20, 2018 in connection with Korean Patent Application No. 10-2015-7006374, 4 pages.

(56) References Cited

OTHER PUBLICATIONS

Article: "Spherical Lenses" (Jan. 18, 2009); pp. 1-12; retrieved from the Internet: URL:http://www.physicsinsights.org/simple_optics_spherical_lenses-1.html.
Drinkwater, K. John, et al., "Development and applications of Diffractive Optical Security Devices for Banknotes and High Value Documents", Optical Security and Counterfeit Deterrence Techniques III, 2000, pp. 66-79, SPIE vol. 3973, San Jose, CA.
Fletcher, D.A., et al., "Near-field infrared imaging with a microfabricated solid immersion lens", Applied Physics Letters, Oct. 2, 2000, pp. 2109-2111, vol. 77, No. 14.
Gale, M. T., et al., Chapter 6—Replication, Micro Optics: Elements, Systems and Applications, 1997, pp. 153-177.
Hardwick, Bruce and Ghioghiu Ana, "Guardian Substrate as an Optical Medium for Security Devices", Optical Security and Counterfeit Deterrence Techniques III, 2000, pp. 176-179, SPIE vol. 3973, San Jose, CA.
Hutley, M.C., et al., "The Moiré Magnifier", Pure Appl. Opt. 3, 1994, pp. 133-142, IOP Publishing Ltd., UK.
Hutley, M.C., "Integral Photography, Superlenses and the Moiré Magnifier", European Optical Society, 1993, pp. 72-75, vol. 2, UK.
Hutley, M., et al., "Microlens Arrays", Physics World, Jul. 1991, pp. 27-32.
Kamal, H., et al., "Properties of Moiré Magnifiers", Opt. Eng., Nov. 1998, pp. 3007-3014, vol. 37, No. 11.
Leech, Patrick W., et al., Printing via hot embossing of optically variable images in thermoplastic acrylic lacquer, Microelectronic Engineering, 2006, pp. 1961-1965, vol. 83, No. 10, Elsevier Publishers BV, Amsterdam, NL.
Lippmann, G., "Photgraphie—Épreuves Réversibles, Photographies Intégrals", Académie des Sciences, 1908, pp. 446-451, vol. 146, Paris.
Liu, S., et al., "Artistic Effects and Application of Moiré Patterns in Security Holograms", Applied Optics, Aug. 1995, pp. 4700-4702, vol. 34, No. 22.
Phillips, Roger W., et al., Security Enhancement of Holograms with Interference Coatings, Optical Security and Counterfeit Deterrence Techniques III, 2000, pp. 304-316, SPIE vol. 3973, San Jose, CA.
Steenblik, Richard A., et al., Unison Micro-optic Security Film, Optical Security and Counterfeit Deterrence Techniques V, 2004, pp. 321-327, SPIE vol. 5310, San Jose, CA.
Van Renesse, Rudolf L., Optical Document Security, 1994, Artech House Inc., Norwood, MA.
Van Renesse, Rudolf L., Optical Document Security, 1998, 2nd edition, pp. 232-235, 240-241 and 320-321, Artech House Inc., Norwood, MA (ISBN 0-89006-982-4).
Van Renesse, Rudolf L., Optical Document Security, 2005, 3rd edition, pp. 62-169, Artech House Inc., Norwood, MA (ISBN 1-58053-258-6).
Wolpert, Gary R., Design and development of an effective optical variable device based security system incorporating additional synergistic security technologies, Optical Security and Counterfeit Deterrence Techniques III, 2000, pp. 55-61, SPIE vol. 3973, San Jose, CA.
Zhang, X., et al., "Concealed Holographic Coding for Security Applications by Using a Moire Technique", Applied Optics, Nov. 1997, pp. 8096-8097, vol. 36, No. 31.
Office Action dated Sep. 10, 2018 in connection with Australian Application No. AU2017235929, 3 pages.
Amidror, "A Generalized Fourier-Based Method for the Analysis of 2D Moiré Envelope-Forms in Screen Superpositions", Journal of Modern Optics (London, GB), vol. 41, No. 9, Sep. 1, 1994, pp. 1837-1862, ISSN: 0950-0340.
Dunn, et al., "Three-Dimensional Virtual Images for Security Applications", Optical Security and Counterfeit Deterrence Techniques V, (published Jun. 3, 2004), pp. 328-336, Proc. SPIE 5310.
Muke, "Embossing of Optical Document Security Devices", Optical Security and Counterfeit Deterrence Techniques V, (published Jun. 3, 2004), pp. 341-349, Proc. SPIE 5310.
Intellectual Property India, "Examination report under sections 12 & 13 of the Patents Act, 1970 and the Patents Rules, 2003," Application No. IN 1934/DELNP/2015, dated Jul. 29, 2019, 6 pages.
IMPI Mexican Institute Industrial Property, "Notification of 1st in-depth requirement," Application No. MX/a/2015/002072, dated May 8, 2019, 8 pages.
IP Australia, "Examination report No. 2 for standard patent application," Application No. AU2017235929, dated Aug. 14, 2019, 3 pages.
IP Australia, "Examination report No. 3 for standard patent application," Application No. AU2017235929, dated Sep. 10, 2019, 3 pages.
Canadian Intellectual Property Office, Office Action in connection with Application No. CA 2,881,826, dated Oct. 3, 2019, 4 pages.
Brazil Instituto Nacionalda Propriedade Industrial, Office Action in connection with Application No. BR112015003455-1, dated Oct. 11, 2019, 5 pages.
European Patent Office, "Communication pursuant to Article 94(3) EPC," Application No. EP12766740.0, dated Sep. 23, 2019, 4 pages.
Office Action in connection with Mexican Application No. MX/a/2015/002072 dated Dec. 17, 2019, 6 pages.
Examination report No. 1 in connection with Australian Application No. 2019229332 dated Sep. 12, 2020, 4 pages.
Examination report No. 2 in connection with Australian Application No. 2019229332 dated Oct. 6, 2020, 4 pages.

* cited by examiner

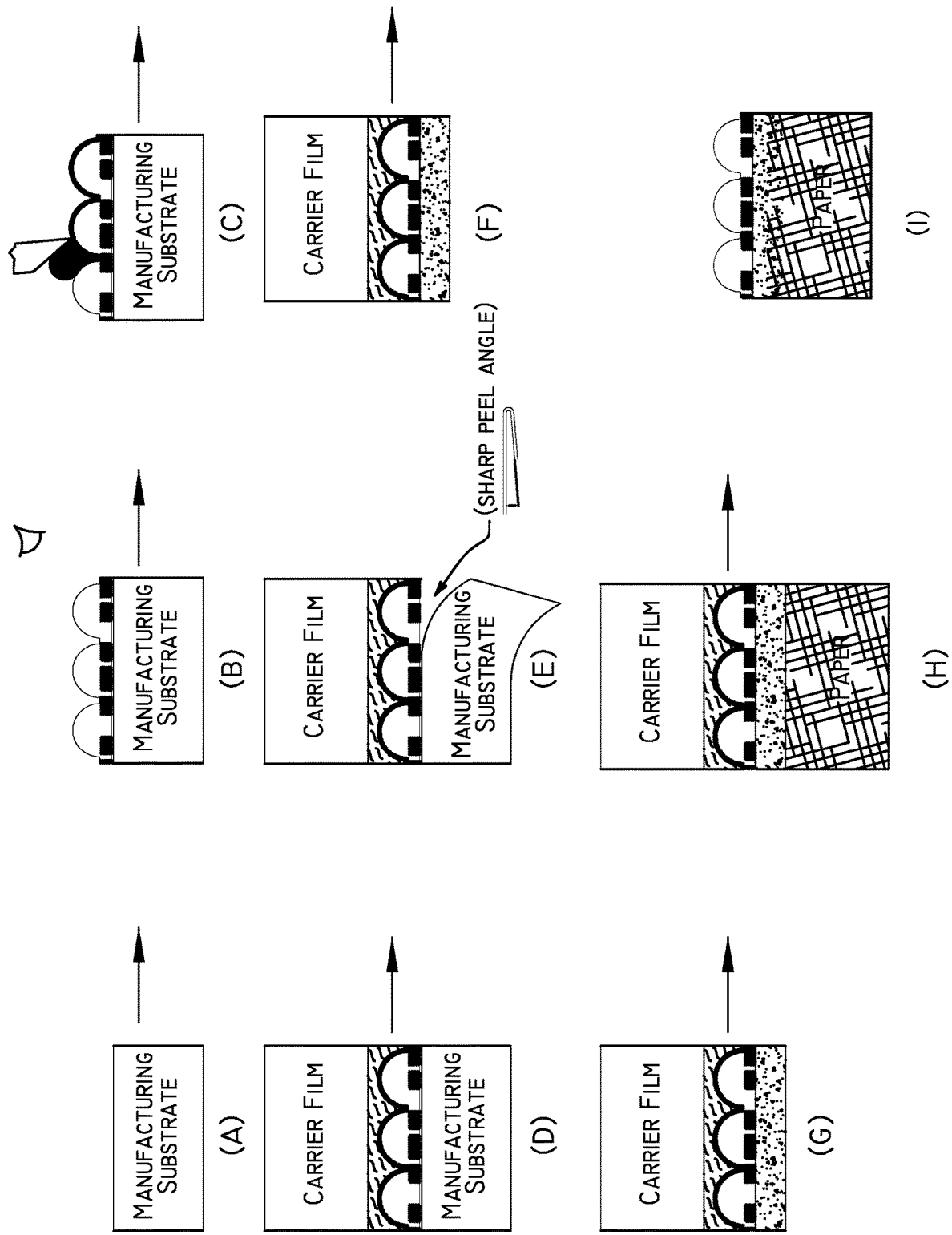

PROCESS FOR TRANSFERRING MICROSTRUCTURES TO A FINAL SUBSTRATE

CROSS REFERENCE TO RELATED APPLICATION AND CLAIM OF PRIORITY

The present application claims priority under 35 U.S.C. § 120 as a divisional of U.S. patent application Ser. No. 14/421,394, filed Feb. 12, 2015, which claims priority under 35 U.S.C. § 365 and is a 371 National Stage of International Application No. PCT/US2012/051395, filed Aug. 17, 2012, the contents of which are herein incorporated by reference.

TECHNICAL FIELD

The present invention generally relates to a continuous roll-to-roll process for producing and transferring security devices in the form of microstructures from a transfer film to a final substrate.

BACKGROUND AND SUMMARY OF THE INVENTION

Security threads as well as security patches may be mounted on a surface of a security document (e.g., currency or banknote paper) or label either during or post manufacture. Mounting of these devices may be achieved by any number of known techniques including: applying a pressure-sensitive adhesive to the backside of the device and pressing the device to the surface of the document or label; and applying a heat activated adhesive to the backside of the device and applying the device using thermal transfer techniques, to the surface of the document or label.

The production of these security devices and the application of these devices to security documents or labels take place in separate operations. Combining these operations in a continuous roll-to-roll process for producing and transferring these security devices to a final substrate would realize advantages in both speed and precision.

The present invention fulfills this need by providing a continuous roll-to-roll process for producing and transferring security devices in the form of microstructured elements or microstructures from a transfer film to a final substrate.

More specifically, the present invention provides a transfer film for transferring microstructures to a final substrate. The microstructures transferred by the transfer film to a final substrate are single or multi-layer structures that comprise: voids in a substantially planar surface, the voids optionally filled or coated with another material; raised areas in a substantially planar surface; or combinations thereof.

In a first exemplary embodiment, the transfer film comprises a carrier film and one or more thermal release adhesive layers on a surface of the carrier film, wherein the thermal release adhesive layer(s) is made up of a plurality of expandable microspheres and one or more pressure sensitive adhesives.

The term "thermal release adhesive", as used herein, means an adhesive that decreases its adhesion to a surface when heated to temperatures higher than about 60° C., while the term "expandable microspheres", as used herein, means polymer microspheres that start expansion and/or foaming when heated to temperatures higher than about 60° C.

Thermal release adhesives (e.g., thermal release tapes) are known in the art and have been used in semiconductor wafer processing and other electronic component manufacturing processes. Suppliers of thermal release products used for electronic applications include Nitto Denko Corporation, 1-2, Shimohozumi 1-chome Ibaraki-shi, Osaka Japan (Nitto Denko), which sells REVALPHA® thermal release adhesive tapes and sheets, and Haeun Chemtec Co., Ltd., Shingil-dong, Danwon-gu, Ansan, Kyungki-do, 425-839, Korea, which sells REXPAN™ heat release film. However, the thickness and cost of these products are prohibitive for anything other than small scale samples, and are not suitable for volume production as described herein.

The term "pressure sensitive adhesive", as used herein, means an adhesive that needs only minimal pressure to adhere or stick to a surface.

In an exemplary embodiment, the one or more thermal release adhesive layers are prepared from a formulation comprising from about 25 to about 99% by wt. (preferably, from about 75 to about 97% by wt., more preferably, from about 90 to about 96% by wt.) of an energy (e.g., ultraviolet (UV) radiation) curable pressure sensitive adhesive (PSA) formulation, and from about 1 to about 75% by wt. (preferably, from about 3 to about 25% by wt., more preferably, from about 4 to about 10% by wt.) of expandable microspheres.

In this exemplary embodiment, the energy curable PSA formulation generally comprises:
from about 5 to about 95% by wt. (preferably, from about 10 to about 70% by wt., more preferably, from about 30 to about 60% by wt.) of one or more elastomeric oligomers;
from about 1 to about 75% by wt. (preferably, from about 5 to about 60% by wt., more preferably, from about 10 to about 40% by wt.) of one or more tackifying resins;
from about 0.5 to about 75% by wt. (preferably, from about 5 to about 60% by wt., more preferably, from about 20 to about 50% by wt.) of one or more reactive monomeric diluents; and
from about 0.1 to about 15% by wt. (preferably, from about 1 to about 8% by wt., more preferably, from about 3 to about 6% by wt.) of one or more photoinitiators.

In a second exemplary embodiment, the transfer film comprises a carrier film and one or more cured binder layers. In this embodiment, the microstructures have one or more cured conformal release coating layers on a surface thereof, and are bonded to the transfer film by way of the one or more cured binder layers. Heat is not required to initiate release during transfer of the microstructures.

The present invention further provides a method of using the transfer films described above, which method comprises using the transfer films (a) to transfer the above-described microstructures in a continuous roll-to-roll process to a final substrate, or (b) as manufacturing substrates during production of the microstructures and then to transfer the microstructures in a continuous roll-to-roll process to a final substrate.

Also provided is a process for transferring microstructures to a final substrate. In a first exemplary embodiment, the process comprises subjecting the transfer film first described above in a continuous roll-to-roll process to the following operations: either forming microstructures on, or transferring microstructures to a surface of the thermal release adhesive layer(s) of the transfer film, wherein the microstructures are single or multi-layer structures that comprise: voids in a substantially planar surface, wherein the voids are optionally filled or coated with another material; raised areas in a substantially planar surface; or combinations thereof;

and then transferring the microstructures from the transfer film onto a surface of the final substrate.

In a first preferred embodiment, the process comprises: forming the microstructures on a surface of a disposable manufacturing substrate; bringing the formed microstructures into contact with a surface of the transfer film while applying pressure thereto, thereby activating the pressure sensitive adhesive in the thermal release adhesive layer(s) of the transfer film, adhering the microstructures to its surface; stripping away the disposable manufacturing substrate; applying one or more heat and/or pressure activated adhesives to the microstructures on the transfer film; bringing the adhesive coated microstructures on the transfer film into contact with a surface of the final substrate while applying both heat and pressure to the transfer film, thereby causing the microspheres in the thermal release adhesive layer(s) to expand (or foam) and deactivate the pressure sensitive adhesive, allowing transfer of the microstructures onto the surface of the final substrate, while simultaneously activating the adhesive on the microstructures, allowing the microstructures to adhere to the surface of the final substrate.

This embodiment is particularly suited for microstructures having so-called "up/down non-parity" (e.g., refractive optical systems). As will be readily appreciated by those skilled in the art, such structures are intended to be viewed from a top or upper side rather than a bottom or lower side. The inventive process allows the microstructures on the disposable manufacturing substrate to be visually inspected for quality assurance purposes before transferring the microstructures to the transfer film, and further allows the microstructures to be properly positioned in an upright position on a surface of the final substrate.

In a second preferred embodiment, the process comprises: forming the microstructures on a surface of the thermal release adhesive layer(s) of the transfer film; applying one or more heat and/or pressure activated adhesives to the formed microstructures on the transfer film; bringing the adhesive coated microstructures into contact with a surface of the final substrate while applying both heat and pressure to the transfer film, thereby causing the microspheres in the thermal release adhesive layer(s) to expand (or foam) and deactivate the pressure sensitive adhesive, allowing transfer of the microstructures onto the surface of the final substrate, while simultaneously activating the adhesive on the microstructures, allowing the microstructures to adhere to the surface of the final substrate.

This embodiment is particularly suited for microstructures that do not require an upper/lower surface inspection (e.g., conductive circuit elements or structures). Such structures could be symmetrical in cross section and are not necessarily intended to be viewed from a top or upper side rather than a bottom or lower side.

In a second exemplary embodiment, the process is a continuous roll-to-roll process that comprises:

forming the microstructures on a surface of a disposable manufacturing substrate;

applying one or more release coating layers to a surface of the microstructures, the release coating layer(s) conforming to the microstructure surface, and then curing the release coating layer(s);

applying one or more binder layers to a surface of a carrier film and optionally also to the cured release coated surface of the microstructures, and while these surfaces are in contact with each other, curing the binder layer(s);

mechanically removing the disposable manufacturing substrate from the microstructures now bonded to the carrier film; and then transferring the microstructures from the carrier film onto a surface of the final substrate.

In a preferred embodiment, the microstructures are transferred from the carrier film onto a surface of the final substrate by: applying one or more heat and/or pressure activated adhesives to the microstructures on the carrier film; bringing the adhesive coated microstructures on the carrier film into contact with a surface of the final substrate; applying both heat and pressure to the carrier film and then lifting the carrier film from the microstructures causing separation between the microstructures and the release coating layer(s), thereby allowing transfer of the microstructures onto the surface of the final substrate, while simultaneously activating the adhesive on the microstructures, thereby allowing the microstructures to adhere to the surface of the final substrate.

Other features and advantages of the invention will be apparent to one of ordinary skill from the following detailed description and accompanying drawings.

Unless otherwise defined, all technical and scientific terms used herein have the same meaning as commonly understood by one of ordinary skill in the art to which this invention belongs. All publications, patent applications, patents and other references mentioned herein are incorporated by reference in their entirety. In case of conflict, the present specification, including definitions, will control. In addition, the materials, methods/processes, and examples are illustrative only and not intended to be limiting.

BRIEF DESCRIPTION OF THE DRAWINGS

Particular features of the disclosed invention are illustrated by reference to FIG. 1, which is a schematic flow diagram of the second exemplary embodiment of the inventive process for transferring microstructures to a final substrate. Components in this drawing are not necessarily to scale, emphasis instead being placed upon clearly illustrating the principles of the present disclosure.

DETAILED DESCRIPTION OF THE INVENTION

The subject invention provides methods or processes for producing microstructures (e.g., precision cast microstructures) on a continuous roll-to-roll substrate or film in ways that allow these microstructures to be subsequently transferred to a final substrate. Advantages in speed and precision are realized by using roll-to-roll processes to produce microstructures, while providing a means for transferring the microstructures to a final surface that is not necessarily compatible with or suitable for flexible web processing (e.g., rigid final substrates such as glass). In this way, final substrates may have precision microstructures applied to their surface, without being subjected to all of the conditions which are necessary for the production of, for example, precision cast microstructures.

The present invention is useful in the production of passport security laminates, the application of security patches or seals on value documents, labels on products, thin films or foils to banknotes, conductors or insulating circuit components onto rigid substrates, and other general applications of microstructured elements or microstructures to a surface.

For avoidance of doubt, nanostructures are also contemplated by the present invention, as are (as alluded to above) end-use applications outside of the security field.

Exemplary embodiments of the inventive system will now be disclosed. There is no intent, however, to limit the present disclosure to the embodiments disclosed herein. On the contrary, the intent is to cover all alternatives, modifications and equivalents.

The microstructures used in the present invention are single or multi-layer structures that comprise: voids in a substantially planar surface, the voids optionally filled or coated with another material; raised areas in a substantially planar surface; or combinations thereof. In an exemplary embodiment, the microstructures (e.g., optical or physical structures) are precision cast microstructures that include any and all types of structures whose form may be produced by backfilling a negative void in a cured or hardened matrix on a flexible substrate.

Examples of such contemplated precision cast microstructures include multilayer optical systems such as refractive, reflective, diffractive, and hybrid micro-optic structures, as well as other single or multilayer structures such as conductive traces, circuit patterns, microlenses, waveguides, negative space air lenses, insulating ceramic structures, icon image elements, microtext, anti-reflective structures, light refracting prisms, micromirror structures, patterned semiconductors, patterned or unpatterned metallization, fluorescent security print, porous filtration structures, chemical or electronic sensor elements, photoresist masking structures, ruled gratings, periodic or aperiodic arrays, structures for increasing surface area, tactility altering structures, structures for facilitating mechanical bonding, etc.

Generally speaking, the size of these microstructures (i.e., width or depth) is limited only by that which is achievable by casting from an embossing tool onto a flexible substrate. The size may range from tens of nanometers (a few atomic layers thick) in depth in some cases to a few micrometers in most cases, and up to millimeter scale structures.

Precision casting of microstructures in a roll-to-roll form on a flexible substrate or film has many advantages, particularly when considered together with a transferrable process, as will be described. The term "precision casting", as used herein, means the replication of a microstructured surface having a predesigned pattern of voids and/or raised areas, or negative and positive features.

By using radiation cured polymers on film, or hot embossable films, for example, the surface of the master is copied continuously, and a precise pattern of voids and/or raised areas may be formed in a cured matrix, resulting in precisely formed microstructures or "icon elements." Exemplary processes are described in U.S. Pat. No. 7,333,268 to Steenblik et al., U.S. Pat. No. 7,468,842 to Steenblik et al., U.S. Pat. No. 7,738,175 to Steenblik et al., U.S. patent application Ser. No. 12/820,320 to Steenblik et al., and U.S. patent application Ser. No. 13/360,017 to Samuel M. Cape et al., which are all incorporated herein by reference in their entirety. By casting these structures, each negative space results in a voluminous region that can be backfilled with a second material that can be much different than the material used to cast the matrix. For example, slurries, pastes, dispersions, gels, powders, liquids, and flakes may all be used to fill the voids, resulting in a precision element that is contained within the volume of the matrix. This allows for the formation of shapes using materials that would be difficult or impossible to cast without using this matrix backfilling technique. The backfilled material may be further cured, washed, etc. to ensure desired properties such as degree of crosslinking, etc.

Once a first layer of such backfilled embossed matrix has been formed, any practical number of additional layers may be added thereafter, such as a second layer of backfilled precision elements, or precision elements that are not backfilled such as a microlens layer, or a polymer spacer layer followed by a microlens layer, a metallization layer, or other functional coatings. Additionally, it is possible and often desirable to apply a coating to the flexible substrate before the first microstructured layer is cast, in order to facilitate replication from the embossing master and for removal of the microstructured elements at a later time. This coating may be tailored to provide adhesion or release properties between the flexible substrate and the microstructured layer. For example, such a coating may be prepared from polymers having low surface energy, such as UV curable silicone-modified polyacrylates.

In an example of the first exemplary embodiment of the inventive process for transferring microstructures having "up/down non-parity", the precision cast single or multi-layer microstructures are formed on a flexible disposable manufacturing substrate, and then the microstructures are transferred away from the manufacturing substrate and onto a new carrier film having one or more thermal release adhesive layers. The thermal release adhesive layer(s) is used to provide a strong bond between the new carrier film and the microstructures and to allow for the release of these microstructures at a later time upon the application of heat. To summarize, the inventive process:

a) Enables the removal of the flexible disposable manufacturing substrate (i.e., base film) from the precision cast microstructures, which lack any significant strength, body or structural integrity when taken by themselves;

b) Enables the conversion and handling of the microstructured elements using traditional web or sheet based equipment such that further coatings and adhesives may be applied, and so that the otherwise fragile structures may be slit, die-cut, perforated, sheeted, etc.; and c) Enables the transfer of the microstructures from the thermal release adhesive coated carrier film (i.e., the TRA transfer film) to a final substrate without suffering from damaging effects of the transfer process such as heat, pressure, and tension, while allowing the carrier film to be rewound and discarded after the transfer process is complete.

The thermal release adhesive layer(s) of the transfer film provides a strong bond between the precision cast microstructures and the new carrier film yet has a mechanism for decisive, predictable release at a later time when the microstructures are transferred to the final substrate.

The formulation used to prepare the thermal release adhesive layer(s) of the present invention is made specifically to have strong bonding at room temperatures, and significantly reduced bond strength when elevated temperatures are applied. The adhesive formulation may be said to be 'activated' when it is in the low temperature, high bond strength state, and 'deactivated' when it is in an elevated temperature, diminished bond strength state.

As noted above, the inventive thermal release adhesive formulation, in a more preferred embodiment, comprises from about 90 to about 96% by weight of an energy curable PSA formulation, and from about 4 to about 10% by weight of expandable microspheres.

The energy curable PSA formulation used in the inventive thermal release adhesive formulation, in a more preferred embodiment, comprises:

from about 30 to about 60% by wt. of one or more elastomeric oligomers, which provide high elongation and structure to the formulation;

from about 10 to about 40% by wt. of one or more tackifying resins, which impart elasticity, flexibility and adhesion to the formulation;

from about 20 to about 50% by wt. of one or more reactive monomeric diluents, which serve to modify the degree of crosslinking and the glass transition temperature of the formulation; and from about 3 to about 6% by wt. of one or more photoinitiators.

Specific examples of suitable PSA formulations include, but are not limited to, the following:

PSA Formulation 1:

| | |
|---|---|
| 30 wt. % | trimethylolpropane triacrylate, which is sold under the trade designation SR-351 by Sartomer Company of Exton, PA., USA. (Sartomer) |
| 33 wt. % | aromatic urethane/tackifier oligomer, which is sold under the trade designation CN3000 by Sartomer |
| 33 wt. % | isobornyl acrylate, which is sold under the trade designation SR-506 NS by Sartomer |
| 4 wt. % | liquid mixture of two photoinitiators, sold under the trade designation OMNIRAD 1000 by IGM Resins Inc. of St. Charles, IL, USA (IGM) |

PSA Formulation 2:

| | |
|---|---|
| 19 wt. % | urethane acrylate oligomer, which is sold under the trade designation CN973H85 by Sartomer |
| 32 wt. % | tackifier resin, which is sold under the trade designation S115 by Sartomer |
| 45 wt. % | 2(2-ethoxyethoxy) ethyl acrylate (EOEOEA), a reactive monomeric diluent, which is sold under the trade designation SR256 by Sartomer |
| 4 wt. % | 2-hydroxy-2-methyl-1-phenyl-1-propanone photoinitiator, which is sold under the trade designation OMNIRAD 73 by IGM |

Specific examples of suitable expandable microspheres, which start expansion and/or foaming when heated to temperatures higher than about 60° C., include:

expandable plastic microspheres, sold under the trade designation EXPANCEL® by Casco Adhesives AB, P.O. Box 11538, Stockholm, Sweden 100 01 (Casco);

dry thermoplastic microspheres, sold under the trade designation DUALITE® by Henkel Corporation, One Henkel Way, Rocky Hill, Conn. 06067 (Henkel);

thermal expandable microsphere, sold under the trade designation ADVANCELL EM by Sekisui Kagaku Kogyo Kabushiki Kaisha (dba Sekisui Chemical Co. Ltd.), 4-4, Nishitemma 2-chome, Kita-ku Osaka-shi, Osaka, Japan 530-8565 (Sekisui); and expandable microspheres available from Matsumoto Yushi-Seiyaku Co., Ltd., 2-1-3 Shibukawa-cho Yaoshi, Osaka, Japan (Matsumoto), Kureha Corporation, 3-3-2, Nihonbashi-Hamacho, Chuo-ku, Tokyo, Japan 103-8552 (Kureha), and Hangzhou Hi-Tech Fine Chemical Co., Ltd., Haihong Technical and Industrial Area, Liangzhu Town, Yuhang District, Hangzhou, Zhejiang, China (Haihong Group).

A specific example of a suitable TRA formulation is set forth below:

TRA Formulation:

| | |
|---|---|
| 90 wt. % | a radiation curable PSA formulation, which is sold under the trade designation AROCURE ™ by Ashland Inc., 50 E. RiverCenter Blvd., P.O. Box 391, Covington, KY 41012-0391 (Ashland) |
| 10 wt. % | expandable microspheres, which are sold under the trade designation EXPANCEL ™ by Akzo Nobel Inc., 525 West Van Buren, Chicago, IL 60607, USA (Akzo Nobel). |

The TRA works through the mechanism of microsphere expansion, allowing for precise control of release. During the release process, the adhesive bond strength declines dramatically. In one example, the bond strength of the activated TRA was found to be between 5.3 to 9.6 Newtons/inch (N/in), while the heat-deactivated strength was measured to be approximately 0.9 to 0.1 N/in. Typical microspheres for this use will start expanding at 80-180° C. and continue to expand up to 125-220° C. Once the adhesive has been heated in this way, the tack and bond strength are permanently reduced.

Before expansion, the microspheres preferably range from 5 to 50 microns in diameter, and after heating they preferably expand to 15 to 150 microns in diameter. More preferably, the microspheres range from 6 to 20 microns in diameter before expansion.

Prior to heating, preferable thermal release adhesive layer thicknesses range from 3 to 100 microns and more preferably from 5 to 25 microns. After heating, this layer will typically double in thickness.

Preparation of the TRA formulation may be accomplished by combining premixed energy curable PSA in its liquid state with the weighed quantity of polymeric microspheres (e.g., polymeric microsphere powder), followed by blending with a high shear mixer. The resulting suspension of powder with energy curable PSA will remain stable in its liquid form for an extended period of time as long as exposure to sources of heat and UV radiation are avoided.

The TRA formulation is applied to a carrier film. Suitable carrier films may be any flexible material that is capable of receiving a coating and being conveyed through production equipment. For example, polymeric materials such as biaxially oriented polyethylene terephthalate (PET), polypropylene (PP), nylon 6 polyamide (PA), polyethylene napthalate (PEN), cellulose acetate or other film materials, as well as non-polymeric materials such as paper constitute suitable carrier films.

Methods suitable for liquid adhesive application may be used to apply the TRA formulation to a carrier film as long as the microsphere activation temperature is not exceeded. For example, a suitable layer thickness of TRA formulation may be achieved by drawing down onto a carrier film with a wire wrapped rod (e.g., a #14 Meyers rod), or by means of a flexographic printing unit or gravure cylinder. The liquid TRA formulation may be heated above room temperature in order to reduce the viscosity for ease of application (i.e., to facilitate pumping or pouring) as long as the microsphere activation temperature is not exceeded. When a thin layer has been applied to the carrier film with the desired thickness (e.g., 15 micron thickness), the TRA may be cured by UV radiation, for example, by passing the coated carrier film beneath a 300 Watts/in Hg lamp at 40 fpm. Alternatively, the TRA may be electron beam cured by passing the uncured resin through an e-beam curing unit. In addition, both methods may be used in combination.

Once cured, the TRA becomes activated so that it has high tack and peel strength (e.g., peel strength values ranging from about 5 to about 50 N/in (ASTM D903-98)), and is ready to be brought into contact with the desired bonding surface. For example, a flexible micro-optic security film may be brought into contact with the TRA and carrier film (i.e., the TRA transfer film), forming a laminated structure that remains bonded until it is desirable to release the bond by application of heat.

The entire laminated structure thus formed may then be rewound and handled as a single flexible film, allowing further processing such as: stripping away the base manufacturing film, applying adhesives on the exposed side of the micro-optic film, die cutting, printing, metalizing, or other film converting operations. The adhesive bond of the TRA may then be deactivated by heating (e.g., 80-220° C.) at a point in time when it is advantageous to transfer the microstructure from the TRA transfer film (e.g., TRA/60 gauge PET carrier film) onto the final substrate. As noted above, such a process may be useful in the production of passport security laminates, the application of security patches or seals on value documents, labels on products, thin films or foils to banknotes, conductors or insulating circuit components onto rigid substrates, and other general applications of microstructured elements or microstructures to a surface.

Deactivation of the TRA occurs whenever the softening temperature of the polymeric shell of the microspheres has been reached or exceeded, causing volume expansion (or foaming) and a significant decrease in the adhesive bond strength compared to its preheated state. Heating methods suitable for causing deactivation of the TRA include forced hot air, heated roller, infrared heating, oven or hotplate heating, heated foil stamping roller, passport laminator, heated shoe, heated platen, heated bath, and the like.

In a preferred process for transferring microstructures having "up/down non-parity" to a final substrate, the continuous roll-to-roll process comprises:

forming microstructures on a disposable flexible manufacturing substrate;
optionally, backfilling the microstructures with a curable material;
applying an energy curable TRA in liquid form to a separate carrier film and curing by application of UV light, e-beam radiation, or both, thereby forming a "TRA transfer film";
nipping together the formed microstructures on the flexible manufacturing substrate to the TRA layer of the TRA transfer film, thereby activating the pressure sensitive adhesive in the TRA layer and allowing the adhesive to adhere the microstructures to the TRA layer;
stripping away the disposable flexible manufacturing substrate;
converting the microstructure/TRA transfer film using methods known in the art, including, but not limited to, applying other heat and/or pressure activated adhesives (e.g., tack-free, heat-activated adhesives), primers or coatings, to the transfer film, followed by slitting or die cutting the film to desired final dimensions, and sheeting the cut film into stacks or rewinding onto reels or spools, thereby forming a "transfer ready system";
transferring the adhesive-coated microstructures to a final substrate by bringing the microstructures on the transfer ready system into contact with the final substrate for thermal lamination, whereby heat and pressure are applied to the transfer ready system, thereby causing the microspheres in the TRA layer to expand (or foam) and deactivate the pressure sensitive adhesive, thereby allowing transfer of the microstructures onto the surface of the final substrate, while simultaneously activating the adhesive on the microstructures, allowing the microstructures to adhere to the surface of the final substrate; and
rewinding and discarding the transfer film with deactivated TRA, leaving the final substrate with newly affixed microstructures on its surface, ready for further processing or printing as desired.

In an exemplary embodiment, the microstructure is a multi-layer optical system in the form of a security thread or foil, and the final substrate is banknote paper. In this exemplary embodiment, the heat and pressure of lamination causes the thread/foil to securely bond to the banknote paper, while at the same time exceeding the deactivation temperature of the TRA, thereby causing the TRA and carrier film to separate from the thread/foil. This process provides an advantageous means of delivering a security thread/foil to banknote paper, following by rewinding and discarding the carrier film containing deactivated TRA.

In another exemplary embodiment, the microstructure is a die-cut, heat-seal label, and the final substrate is product packaging.

In an exemplary embodiment of the inventive process for transferring microstructures having "up/down parity" (i.e., cross-sectional symmetry), the precision cast single or multi-layer microstructures are formed directly on the TRA transfer film, and then the microstructures are transferred away from the TRA transfer film onto the final substrate. In this configuration, care must be taken to avoid overheating the TRA during the microstructure casting step. Casting resins with low viscosities (resins that do not need additional heat to flow freely such as neopentyl glycol diacrylate (available from Sartomer under the trade designation SR247)), combined with an internally water cooled casting surface (comparable to a flexographic chill drum) allow microstructures to be UV cured against the TRA without overheating the expandable microspheres or causing premature expansion.

In a preferred process, the continuous roll-to-roll process comprises:

applying an energy curable TRA in liquid form to a separate carrier film and curing by application of UV light, e-beam radiation, or both, thereby forming a "TRA transfer film";
forming microstructures on the TRA transfer film;
optionally, backfilling the microstructures with a curable material;
converting the microstructure/TRA transfer film by applying other heat and/or pressure activated adhesives (e.g., tack-free, heat-activated adhesives), primers or coatings, to the transfer film, followed by slitting or die cutting the film to desired final dimensions, and sheeting the cut film into stacks or rewinding onto reels or spools, thereby forming a "transfer ready film";
transferring the adhesive-coated microstructures to a final substrate by bringing the microstructures on the transfer ready system into contact with the final substrate for thermal lamination, whereby heat and pressure are applied to the transfer ready system, thereby causing the microspheres in the TRA layer to expand (or foam) and deactivate the pressure sensitive adhesive, thereby allowing transfer of the microstructures onto the surface of the final substrate, while simultaneously activating the adhesive on the microstructures, allowing the microstructures to adhere to the surface of the final substrate; and rewinding and discarding the transfer film with deactivated TRA, leaving the final substrate with newly affixed microstructures on its surface, ready for further processing or printing as desired.

In an exemplary embodiment, the microstructure is an embedded lens array structure, and the final substrate is a laser engravable polycarbonate substrate. Here, the embedded lens array structure is made up of a low refractive index (RI) (e.g., n=1.35-1.45) concave polymeric matrix backfilled with high RI (e.g., n=1.5-1.8) polymer, the applied adhesive is a heat-activated adhesive, and the embedded lens array structure of the transfer ready film is brought into contact with a surface of the laser engravable polycarbonate substrate and heated under pressure to a point in which the embedded lens array structure is thermally laminated to the surface of the polycarbonate substrate. In this embodiment, the heat and pressure of lamination causes the embedded lens structure to securely bond to the intended polycarbonate final substrate, while at the same time exceeding the deactivation temperature of the TRA, causing the TRA transfer film to separate from the embedded lens structure. This process provides an advantageous means of delivering a lens structure to a surface of a laser engravable polycarbonate surface, such that further processing steps may occur, such as laser writing through the lens structure into the polycarbonate, providing an optically variable laser written effect.

In another exemplary embodiment, the microstructure is a reflective optical system, and the final substrate is currency or banknote paper. In this embodiment, the reflective optical system is cast against the TRA transfer film. It is suitable to form such a multi-layer microstructure directly onto the TRA transfer film that will be used to transfer the optics to the final substrate (rather than onto a flexible disposable manufacturing substrate followed by transferring onto the TRA transfer film). This is so because a reflective optical system operates with the reflector side against the final substrate and so is compatible and advantageous to use with this method.

To produce this reflective optical system, the following method may be used. A thin layer (e.g., 5 microns) of TRA is coated onto a 60 gauge film of PET and cured by application of UV light. Next, icons are formed as voids in a radiation cured liquid polymer (e.g., acrylated urethane) that is cast from an icon mold, then the icon voids are filled with a submicron particle pigmented coloring material by gravure-like doctor blading against the polymeric icon surface, then the fill is solidified by suitable means (e.g., solvent removal, radiation curing, or chemical reaction), then the reflective lens elements are cast against the filled icons by bringing the icon side of the film against a lens mold filled with radiation curable polymer, and the polymer is solidified by application of UV light or other actinic radiation. Next the lens elements are metalized (e.g., with aluminum) using a physical vapor deposition process, which is known in the art of holographic foil manufacture. Following metallization, an optional sealing layer may be applied to further protect the metal coating, followed by the application and drying of an adhesive, for example, a tack-free, heat-activated polyurethane foiling adhesive. Next, the entire structure (i.e., TRA transfer film with optical microstructure (icon layer/reflective lens elements/metal reflecting layer/sealing layer/adhesive layer)) may be converted into its final form by undergoing slitting and rewinding onto reels that are compatible with holographic foil transfer equipment. In this form, the micro-optic system may be transferred away from the TRA transfer film and onto the final substrate by the application of heat and pressure. For example, the structure may be brought into contact with currency or banknote paper while a foiling die applies pressure at 140° C. At this temperature, the foiling adhesive bonds the structure (by the side having reflector elements) to the final paper substrate, while the TRA provides the mechanism for release of the micro-optic system from the TRA transfer film. Then the desired final product (paper with surface applied reflective micro-optics) is rewound and the waste TRA transfer film is rewound and discarded or recycled.

In yet another exemplary embodiment, the microstructures are conductive circuit traces, and the final substrate is a glass substrate, which constitutes a subassembly of a touch screen display. In this embodiment, heat and pressure causes the conductive circuit traces to bond to the glass substrate, while releasing from the TRA transfer film. This process provides a means of producing the microstructure conductive circuit traces in high volume on a roll-to-roll basis, and subsequent delivery to an inflexible final substrate, resulting in an economically produced subassembly of a touch screen display.

In a further exemplary embodiment, the microstructure is in the form of a regular array of microstructured pre-ceramic polymers, and the final substrate is a quartz substrate, which forms a temperature sensing diffraction grating. In this embodiment, heat and pressure allows the 'green cured' array of pre-ceramic polymers (referring to a ceramic that is yet to be fired) to transfer away from the TRA transfer film and onto the quartz substrate. Next, the quartz and pre-ceramic are fired in a kiln at high temperatures (e.g., 1400-1600° C.), resulting in a sintered ceramic microstructure fused to a quartz substrate.

This process provides a means of producing a microstructured diffraction grating using ceramic precursors in high volume and at low temperatures on a roll-to-roll basis, and subsequent transfer to an inflexible final substrate. In this way, further processes incompatible with a flexible web can occur such as high temperature firing, resulting in the formation of a microstructured ceramic surface that can survive extremes in temperature exposure, but is produced using economical flexible web processes. In this example, the microstructured ceramic grating on quartz substrate finds use as a temperature monitor or a strain gauge. By reflecting a laser off of its surface and measuring the distance between the reflected bright zones (areas of constructive interference), highly accurate changes in groove spacing due to temperature or strain can be detected and calculated.

An alternative process for transferring microstructures to a final substrate will now be described. This alternative process provides improvements in overall system thickness, transfer speed, stability over time, and elimination of residue on the transferred microstructures.

The alternative process does not require the use of heat to initiate release of the microstructures from the carrier film (and thus is compatible with cold foiling methods), although it is still compatible and may be used with thermally activated adhesives. This process is also compatible with a cast spacer between focusing elements (e.g., lenses) and icons, and as such is not limited to the "spacer-less" structure shown in FIG. 1. Additionally, where the release layer(s) and binder layer(s) are 'fully cured' and stable, temperatures encountered during, for example, heated foiling, may facilitate removal of the carrier, but do so without leaving a residue on the microstructures.

As mentioned above, the alternative process for transferring microstructures employs:
1) one or more release coatings, which are applied to (and conform to) an upper surface of the microstructures, and are cured; and
2) one or more binder layers, which are cured in contact with the carrier film and the cured release coating(s) on the upper surface of the microstructures.

Together, these layers serve to bind the microstructures firmly to the carrier film until a later time when it is desirable to transfer the microstructures to a final substrate such as currency paper and to discard the carrier film. Moreover, by employing a fully cured binder, temperature and pressure instability is avoided.

The one or more binder layers, in a preferred embodiment, are prepared from an energy curable (e.g., UV curable) binder formulation generally comprising:
(a) from about 0 to about 99.8% by wt. (preferably, from about 10 to about 50% by wt.) of an energy curable polyacrylate oligomer;
(b) from about 0 to about 99.8% by wt. (preferably, from about 20 to about 80% by wt.) of an energy curable acrylate monomer; and
(c) from about 0.2 to about 35% by wt. (preferably, from about 1 to about 12% by wt.) of a free radical photoinitiator.

The binder formulation may be applied between the carrier film and microstructures (when still attached to the manufacturing substrate) during the continuous roll-to-roll process. The formulation is applied at thicknesses ranging from about 0.5 to about 25 microns (preferably, from about 2 to about 10 microns), and the layers bonded using, for example, a traditional wet lamination process where the two layers are brought together with uncured resin between the layers and then cured together. A relatively strong bond to the carrier film is realized such that release never occurs at the interface between the binder layer(s) and the carrier film. In a preferred embodiment, a carrier film having 'print receptive' surface treatment is used, while in another preferred embodiment, the surface energy of the carrier film is modified during production using, for example, corona or plasma pretreatment.

In a more preferred embodiment, the one or more binder layers are prepared from a formulation comprising:
(a) 40 wt. % of an energy curable polyacrylate oligomer sold under the trade designation CN293 by Sartomer;
(b) 60 wt. % of an energy curable acrylate monomer sold under the trade designation CD420 by Sartomer; and
(c) 4 wt. % of a liquid mixture of two photoinitiators sold under the trade designation OMNIRAD 1000 by IGM.

In order to prevent a permanent bond between the binder and microstructures (e.g., a microlens-based film structure), the microstructures are first treated with a 'release' formulation that has low bond strength (i.e., peel strength of less than 1 N/in (ASTM D903-98)). In this way, the cured binder bonds strongly to the carrier film and also bonds strongly to the cured release coating layer(s). This combination provides a bond which is strong under one set of conditions (favorable for removal of the manufacturing substrate) as well as a bond that is easily broken under another set of conditions (favorable for transfer of the microstructures to final substrate).

The one or more conformal release coating layers, in a preferred embodiment, are prepared from an energy curable (e.g., UV curable) formulation generally comprising:

(a) from about 1 to about 98 wt. % (preferably, from about 5 to about 20 wt. %) of isodecyl acrylate;
(b) from about 2 to about 50 wt. % (preferably, from about 10 to about 35 wt. %) of a free radical photoinitiator; and
(c) from about 0 to about 90 wt. % (preferably, from about 10 to about 80 wt. %) of 2-propanol (isopropyl alcohol).

The formulation, which has been found to work over a range of dilutions with isopropyl alcohol, is applied by roll coating, or other suitable method for applying a fluid to a flexible substrate (e.g., flexo coating, anilox coating, gravure coating, metering rod (Meyer bar), curtain coating, rotary screen, silk screen, immersion, reverse roll, knife-over-roll, gap coating, or air knife) at thicknesses ranging from about 0.1 to about 10 microns, preferably, from about 0.5 to about 2 microns. The viscosity of the formulation ranges from about 2 to about 50 centipoise (cps) (preferably, from about 5 to about 15 cps), allowing the formulation to conform to the surface of the microstructures. The release coating layer(s), both before and after full cure, have a sufficiently low interfacial bond strength. In particular, the interfacial bond strength is low enough that when the microstructures are bonded to the final substrate by an adhesive and the carrier film is peeled away, separation will occur at the interface of the microstructures and the release coating layer(s). The ease of separation is controlled by the component properties of the release coating. For example, a monofunctional component such as isodecyl acrylate with a low glass transition temperature ($T_g=-60°$ C.) will have a much lower bond strength than a higher functionality component such as trimethylolpropane ethoxy triacrylate (TMPEOTA) ($T_g=37°$ C.), which has a larger number of reactive sites per polymer molecule. During hot or cold foiling operations, the necessary force for breaking this bond is supplied as tension when the carrier film is pulled away from the microstructures and rewound on a waste reel.

In a more preferred embodiment, the release formulation comprises:
(a) 10 wt. % of isodecyl acrylate;
(b) 30 wt. % of a liquid mixture of two photoinitiators sold under the trade designation OMNIRAD 1000 by IGM; and
(c) 60 wt. % of isopropyl alcohol.

The conditions that provide either a strong bond or weak bond using this construction are determined by the geometry of separation (i.e., by the angle at which the manufacturing substrate is peeled away relative to the carrier film). With a low angle of peel (i.e., obtuse angles greater than 90 to about 180°), the bond is high between the carrier and the microstructures, due to the distribution of force over a larger area (similar to the difficulty of separating two flat plates of glass with a layer of water between). With a high angle of peel (i.e., acute angles less than 90 to about 0°), the stress is concentrated to a smaller region, breaking bonds at the interface closest to the source of stress, allowing the manufacturing substrate to be removed without disrupting the bond between the microstructures and the carrier film. Once the manufacturing substrate has been removed and the adhesive applied, the microstructures may be applied to the final substrate such as paper on a commercial foiling unit (e.g., a Leonard Kurz MHS foiling machine), or passport booklet laminating machine. This equipment is designed to lift away carrier films to rewind and discard, and this lifting process easily breaks the bond between the microstructures and the film at the release coating interface.

Referring now to FIG. 1 in detail, a schematic flow diagram of one embodiment of this alternative process for transferring microstructures to a final substrate is shown generally at 10. The inventive process is a continuous roll-to-roll process that in this exemplary embodiment comprises:

forming the microstructures on a surface of a disposable manufacturing substrate (shown generally in process steps (A) and (B) in FIG. 1);

applying one or more release coating layers to a surface of the microstructures, the release coating layer(s) conforming to the microstructure surface, and then curing the release coating layer(s) (shown generally in process step (C) in FIG. 1);

applying one or more binder layers to a surface of a carrier film and optionally also to the cured release coated surface of the microstructures, and while these surfaces are in contact with each other, curing the binder layer(s) (shown generally in process step (D) in FIG. 1);

mechanically removing the disposable manufacturing substrate from the microstructures now bonded to the carrier film (shown generally in process step (E) in FIG. 1);

converting the bonded or laminated film structure using methods known in the art, including, but not limited to, applying other heat and/or pressure activated adhesives (e.g., tack-free, heat-activated adhesives), primers or coatings, to the film structure (shown generally in process step (F) in FIG. 1), followed by slitting or die cutting the structure to desired final dimensions (shown generally in process step (G) in FIG. 1), and sheeting the cut film into stacks or rewinding onto reels or spools, thereby forming a "transfer ready system";

transferring the adhesive-coated microstructures to a final substrate by bringing the microstructures on the transfer ready system into contact with the final substrate (shown generally in process step (H) in FIG. 1) for thermal lamination, whereby heat and pressure are applied to the transfer ready system and then the carrier film is lifted from the microstructures causing separation between the microstructures and the release coating layer(s), thereby allowing transfer of the microstructures onto the surface of the final substrate, while simultaneously activating the adhesive on the microstructures, thereby allowing the microstructures to adhere to the surface of the final substrate; and rewinding and discarding the carrier film (shown generally in process step (I) in FIG. 1), leaving the final substrate with newly affixed microstructures on its surface, ready for further processing or printing as desired.

As noted above, this alternative process provides improvements in overall system thickness and transfer speed. The binder layer(s) is cured between films allowing the binder to be rolled out to a very thin layer between the films, which reduces overall system caliper. This reduction in caliper translates into run speed improvements because the conductance of heat through the system is faster when there is less material acting as a thermal mass to slow down the melting of the adhesive.

Other features and advantages of the invention will be apparent to one of ordinary skill from the following detailed description and accompanying drawings. Unless otherwise defined, all technical and scientific terms used herein have the same meaning as commonly understood by one of ordinary skill in the art to which this invention belongs. All publications, patent applications, patents and other references mentioned herein are incorporated by reference in their entirety. In case of conflict, the present specification, including definitions, will control. In addition, the materials, methods, and examples are illustrative only and not intended to be limiting.

What is claimed is:

1. A process for transferring microstructures to a final substrate, the process comprising:
   subjecting a transfer film to a continuous roll-to-roll process, the continuous roll-to-roll process comprising:
      casting focusing microstructures on a surface of a disposable manufacturing substrate, wherein the focusing microstructures comprise voids in a substantially planar surface, or raised areas in a substantially planar surface;
      transferring the focusing microstructures from the disposable manufacturing substrate to a surface of a carrier film comprising an adhesive layer or a binder layer; and
   applying heat and pressure to the carrier film to release the focusing microstructures from the carrier film; and
   transferring the focusing microstructures from the transfer film onto a surface of the final substrate,
   wherein the focusing microstructures comprise refractive or reflective focusing microstructures.

2. The process of claim 1, wherein the binder layer comprises one or more energy curable polyacrylates and a free radical photoinitiator.

3. The process of claim 1, further comprising:
   prior to transferring the focusing microstructures to the carrier film, applying a release coating layer to a surface of the focusing microstructures, the release coating layer conforming to the surface of the focusing microstructures,
   curing the release coating layer,
   applying the binder layer to a surface of the carrier film, and
   while the surface of the carrier film and the surface of the focusing microstructures are in contact with each other, curing the binder layer.

4. The process of claim 3, wherein the focusing microstructures are cast in a continuous process from a microstructured surface having a predesigned pattern onto the surface of the disposable manufacturing substrate, the predesigned pattern comprising a pattern of at least one of voids or raised areas.

5. The process of claim 3, wherein the release coating layer comprises an isodecyl acrylate, a free radical photoinitiator, or an isopropyl alcohol.

6. The process of claim 3, which further comprises:
   applying a heat activated adhesive or a pressure activated adhesive to coat the focusing microstructures on the carrier film;
   bringing the adhesive coated focusing microstructures on the carrier film into contact with a surface of the final substrate;
   lifting the carrier film from the focusing microstructures, causing separation between the focusing microstructures and the release coating layer, thereby allowing transfer of the focusing microstructures onto the surface of the final substrate; and
   simultaneously activating the heat activated adhesive on the focusing microstructures, thereby allowing the focusing microstructures to adhere to the surface of the final substrate.

7. The process of claim 3, further comprising, applying the binder layer to the cured release coating layer, the binder layer conforming to the surface of the focusing microstructures.

* * * * *